United States Patent

Dozier

[11] 4,317,275
[45] Mar. 2, 1982

[54] METHOD FOR MAKING A DEPLETION CONTROLLED SWITCH

[75] Inventor: Harold W. Dozier, Carrollton, Tex.

[73] Assignee: Mostek Corporation, Carrollton, Tex.

[21] Appl. No.: 110,949

[22] Filed: Jan. 10, 1980

Related U.S. Application Data

[62] Division of Ser. No. 840,679, Oct. 11, 1977, Pat. No. 4,204,131.

[51] Int. Cl.³ .............................................. H01L 21/26
[52] U.S. Cl. .................................... 29/571; 29/576 B; 29/577 C; 148/1.5; 148/187
[58] Field of Search ................ 29/571, 576 B, 577 C; 148/1.5, 187; 357/42

[56] References Cited

U.S. PATENT DOCUMENTS

| | | | |
|---|---|---|---|
| 3,641,366 | 2/1972 | Fujimoto | 307/205 X |
| 3,775,693 | 11/1973 | Proebsting | 307/205 X |
| 3,865,651 | 2/1975 | Arita | 148/187 |
| 3,898,105 | 8/1975 | Mai et al. | 357/91 X |
| 3,969,638 | 7/1976 | Marchetti et al. | 307/251 X |
| 4,009,401 | 2/1977 | Sasaki | 307/251 |
| 4,033,026 | 7/1977 | Pashley | 29/571 |
| 4,041,330 | 8/1977 | Spence et al. | 307/251 |
| 4,084,105 | 4/1978 | Teranishi et al. | 307/241 X |
| 4,204,131 | 5/1980 | Dozier | 307/304 X |

Primary Examiner—G. Ozaki

[57] ABSTRACT

A switch for selecting internal circuit options in MOS-LSI circuits without altering the circuit layout on a semiconductor chip by selectively implanting channels of field-effect transistors such that selected circuit-option lines are coupled to a designated line. Switches may be constructed with multiple inputs and a single output, or with multiple outputs and a single input, or with multiple inputs and multiple outputs. A bidirectional switch may also be constructed by controlling the gate potential of each transistor connecting one of the option lines to the designated line with a two-input switch for selecting either a high or a low gate potential.

2 Claims, 6 Drawing Figures

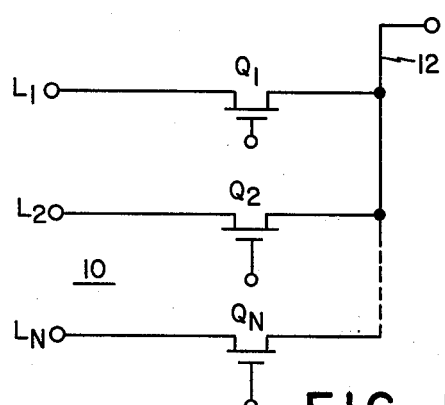
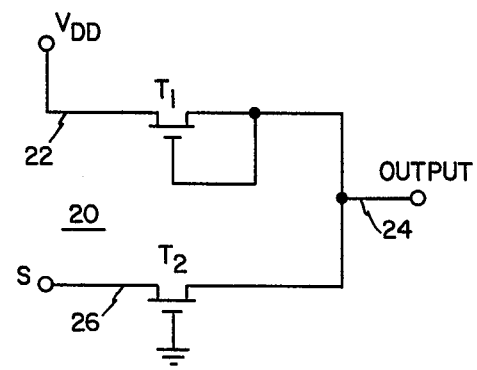
FIG. 1     FIG. 2
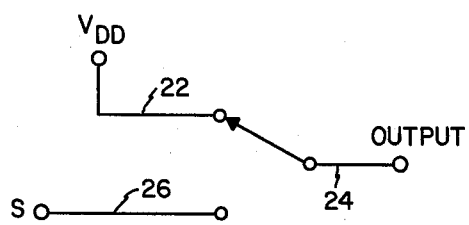
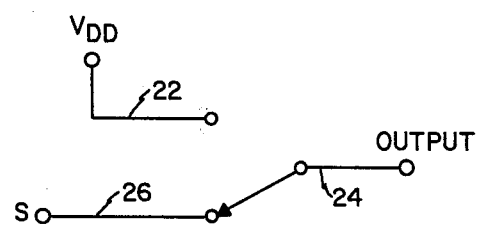
FIG. 2a     FIG. 2b
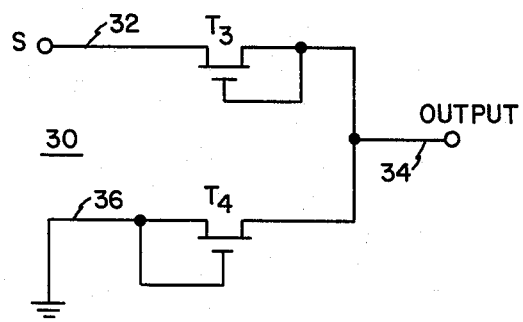
FIG. 3

METHOD FOR MAKING A DEPLETION CONTROLLED SWITCH

This is a division of application Ser. No. 840,679, filed Oct. 11, 1977, now U.S. Pat. No. 4,204,131.

The present invention pertains to integrated circuits, and particularly to devices using MOS/LSI techniques.

The standardization of semiconductor devices is an important cost determining factor. However, with the advent of complex single-chip semiconductor devices, a need has arisen for versatility in chip operation. An example of one such complex semiconductor device is the microcomputer disclosed in commonly assigned U.S. patent application Ser. No. 815,932, filed July 15, 1977, now abandoned. It is desirable to incorporate various so-called "standard customer options" into the design of the microcomputer chip without departing from a standardized chip layout. This objective is facilitated by the techniques of the present invention.

In accordance with the present invention, circuit options of an integrated circuit are selected using switches that are preset during the manufacturing process. Each switch is capable of coupling one or more selected lines of a group of option lines onto a designated line. A field-effect transistor is connected between each option line and the designated line. The transistor on a selected option line is caused to operate in the depletion mode, preferably by a selective ion implant of its channel, whereas the transistor on each nonselected option line is caused to operate in the enhancement mode. The gates of all the transistors of the switch are connected so that, when the circuit is operational, only the selected option line or lines will be coupled to the designated line.

The novel features believed characteristic of the invention are set forth in the appended claims. The nature of the invention, however, as well as its essential features and advantages, may be understood more fully upon consideration of illustrative embodiments when read in conjunction with the accompanying drawing, wherein:

FIG. 1 is a general purpose switch of the present invention;

FIG. 2 is a specific adaptation of the switch of FIG. 1;

FIGS. 2a and 2b illustrate equivalent switch positions which may be produced by the circuit of FIG. 2;

FIG. 3 is an additional circuit adaptation of the switch of the present invention.

Figure 4:
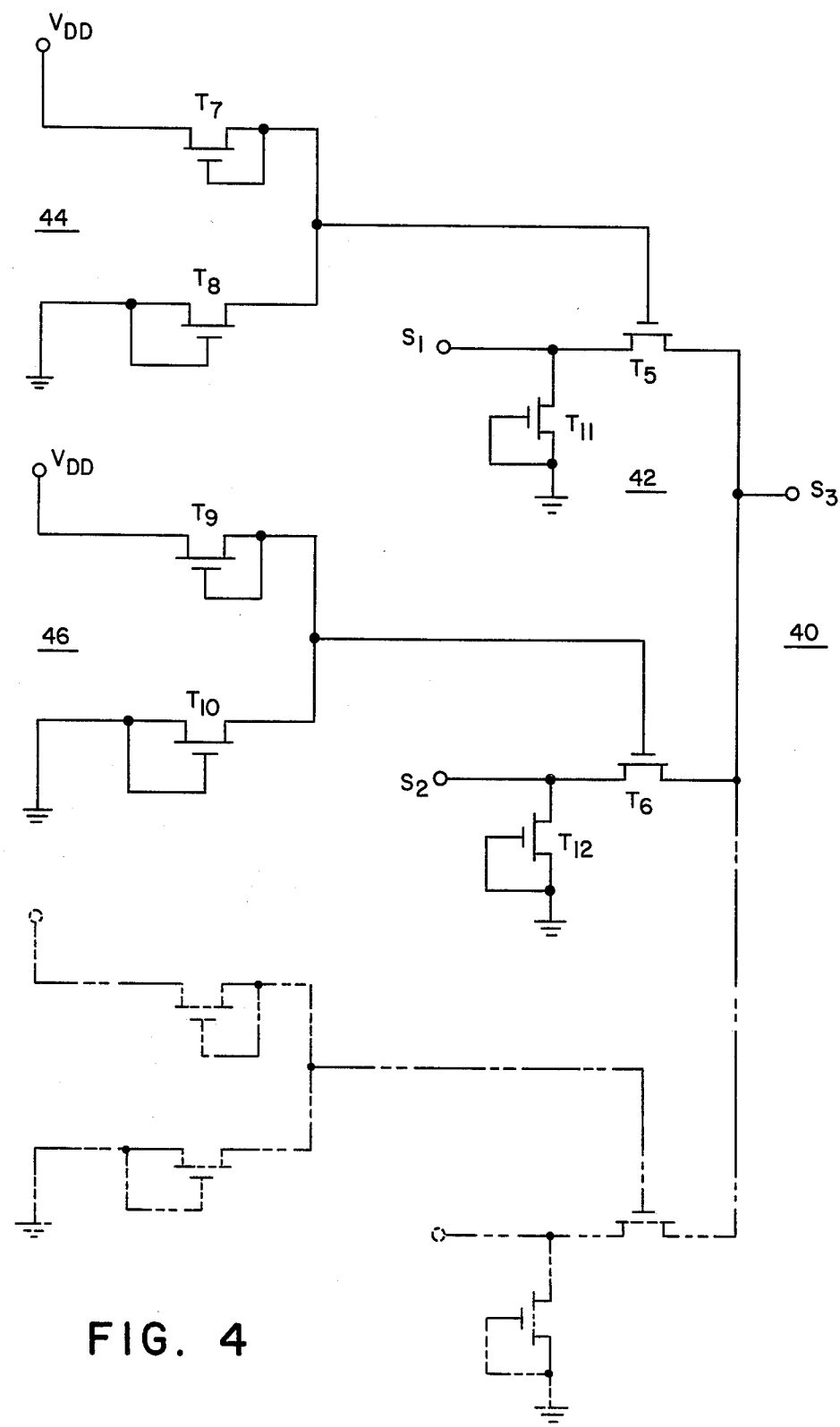
FIG. 4 is a combination of several switches in accordance with another feature of the invention.

Referring now to the drawings, and in particular to FIG. 1, a switch circuit of the present invention is indicated generally by reference numeral 10. The switch 10 is provided with lines $L_1$ through $L_N$, which may be selectively interconnected with a designated line 12. The lines $L_1$ through $L_N$ represent circuit options from other circuitry (not shown).

The switch 10 can be employed in a variety of applications. For example, lines $L_1$ through $L_N$ can serve as optional inputs with line 12 as an output, or line 12 can serve as an input with lines $L_1$ through $L_N$ as optional outputs.

The switch 10 comprises two or more field-effect transistors $Q_1$ through $Q_N$, each being connected between a correspondingly numbered option line and line 12 as shown. Each of the transistors $Q_1$ through $Q_N$ can be selected to be normally on or normally off. This is accomplished during the manufacturing process by selectively causing the transistors to be operable either in the depletion mode or in the enhancement mode. The presently preferred technique for selectively forming depletion mode and enhancement mode transistors on the same semiconductor substrate is by irradiation through masks to cause ions of either a P-type or N-type impurity to be selectively implanted into the channels of certain transistors. Although it is possible to thus use selective ion implantation to dope the channels of either the enhancement mode or depletion mode transistors, it is most preferred that the channels of depletion mode transistors be implanted to convert the conductivity type therein to the same type as their source and drain regions. Such ion implantation can be achieved using known techniques as disclosed in U.S. Pat. No. 3,898,105, the terms of which are hereby incorporated by reference. The gates of the transistors $Q_1$ through $Q_N$ are connected to a suitable potential that causes the depletion mode transistor or transistors to be on and any enhancement mode transistor or transistors to be off during operation of the integrated circuit of which the switch 10 is a part. For example, depending on the particular application, the gates of the transistors might variously be connected to a high potential such as $V_{DD}$, or a low potential such as ground, or to the source node of the transistor, all of which are illustrated by the specific circuit embodiments discussed below.

Thus, the present invention provides a technique for selecting any of several circuit options without altering the circuit layout of a semiconductor chip. The selection is made during the manufacturing process by an appropriate ion-implant mask selectively causing certain transistors of the switch 10 to be operable in the depletion mode while the remaining transistors of the switch 10 are caused to be operable in the enhancement mode. If the preferred technique of U.S. Pat. No. 3,898,105 is used, the transistor sites where a depletion mode transistor is to be formed are implanted to convert its conductivity type, while the remaining transistor sites to be operable in the enhancement mode are masked from the implant so that their channels retain the same conductivity type. Accordingly, it is only necessary to change masks in order to select from different circuit options, a different mask being available for the selection of each desired option.

FIG. 2 shows a specific adaptation of the circuit 10 of FIG. 1 as a two-input switch 20. A first optional input line 22 is connected to a high potential, conventionally designated as $V_{DD}$. The term "high potential" as used herein means any potential suitable for providing a high logic level in an MOS circuit. The polarity of such high potential may be either positive or negative with respect to circuit ground depending on whether the particular integrated circuit is N-channel or P-channel construction. A transistor $T_1$ connects line 22 to an output line 24, the gate of $T_1$ being connected to its source so that, in the event $T_1$ is a depletion mode device, the output 24 will reach very nearly the full potential of $V_{DD}$. A second optional input line 26 is connected to a logic signal S from other circuitry (not shown). A transistor $T_2$ connects line 26 to the output 24. The gate of $T_2$ is preferably connected to circuit ground so that, in the event $T_2$ is an enhancement mode device, it will be held off regardless of the relative voltages on lines 24 and 26.

The operation of the switch 20 will now be described in conjunction with equivalent switch positions illustrated in FIGS. 2a and 2b. For the case in which $T_1$ is a depletion mode device and $T_2$ is an enhancement mode device, the switch 20 is connected as depicted by the circuit of FIG. 2a wherein line 22 is coupled to the output 24 and line 26 is an open circuit. For the case in which $T_2$ is a depletion mode device and $T_1$ is an enhancement mode device, the switch 20 is connected as depicted by the circuit of FIG. 2b wherein line 26 is coupled to the output 24 and line 22 is an open circuit.

An alternate embodiment of a two-input switch is illustrated by the switch circuit 30 of FIG. 3. The first of two inputs is a logic signal S, which can be selectively coupled from line 32 through transistor $T_3$ to an output line 34. The second of two inputs is a low potential, conventionally designated as circuit ground, which can be selectively coupled from line 36 through transistor $T_4$ to the output line 34. For the case in which $T_3$ is a depletion mode device and $T_4$ is an enhancement mode device, signal S will be coupled onto the output 34. For the case in which $T_4$ is a depletion mode device and $T_3$ is an enhancement mode device, group potential will be coupled onto the output 34.

It will be appreciated that two or more circuits 20 can be combined, or that two or more circuits 30 can be combined, or that combinations of both circuits 20 and 30 as well as adaptations thereof can be employed to enable more complex circuit option selection. For example, a single-input/multiple-output switch with provisions for tying nonselected outputs to a fixed potential can be constructed by connecting the S nodes of circuits of the types shown in FIGS. 2 and 3 to a common input line.

FIG. 4 illustrates a practical circuit application 40 using the above described techniques to preset one or both of two option lines $S_1$ and $S_2$ for interconnection to a third line $S_3$. The circuit 40 comprises three switches 42, 44 and 46, each of which is a specific adaptation of the general switch circuit 10 of FIG. 1. The first switch 42 comprises transistor $T_5$ disposed between lines $S_1$ and $S_3$ and transistor $T_6$ disposed between lines $S_2$ and $S_3$. The second switch 44 comprises transistors $T_7$ and $T_8$ for selectively coupling $V_{DD}$ or ground potential onto the gate of transistor $T_5$ of the first switch 42. Similarly, the third switch 46 comprises transistors $T_9$ and $T_{10}$ for selectively coupling $V_{DD}$ or ground potential onto the gate of transistor $T_6$ of the first switch 42. The transistors of switches 44 and 46 have their gates in common with their sources so that with the potentials applied as shown they will only turn on if they have been preset for operation in the depletion mode. Transistors $T_{11}$ and $T_{12}$ provide means for tying lines $S_1$ and $S_2$ to ground so that they will not be left floating when they are not selected to be coupled to line $S_3$. It will be appreciated that the switch 40 is bidirectional. In other words, $S_1$ and $S_2$ may serve as inputs with $S_3$ as an output, or $S_3$ may serve as an input with $S_1$ and $S_2$ as outputs. It will be further appreciated that the circuit 40 may be modified to provide additional inputs or outputs if desired by including additional circuit branches in the manner indicated by the branch shown in phantom.

The operation of the circuit 40 can be best understood by way of an illustrative example. Accordingly, consider the application wherein $S_1$ and $S_2$ are optional outputs of the switch 42 with $S_3$ serving as an input. For the case where $S_1$ is selected to be coupled to $S_3$ while $S_2$ is isolated from $S_3$, transistors $T_5$, $T_7$, $T_{10}$, and $T_{12}$ are preset for operation in the depletion mode, and transistors $T_6$, $T_8$, $T_9$, and $T_{11}$, in the enhancement mode in accordance with the above described selective implantation techniques. With the circuit 40 operational, $T_7$ will be on and $T_8$ will be off so that $V_{DD}$ will be applied to the gate of transistor $T_5$, thereby turning it on. Since $T_{11}$ has been preset as an enhancement mode device with its gate and source at ground, it will be off. Therefore, the voltage on line $S_3$ will be coupled onto line $S_1$. Similarly, $T_9$ will be off and $T_{10}$ will be on so that the gate of enhancement mode transistor $T_6$ will be held at ground potential, thereby keeping it off and isolating line $S_2$ from line $S_3$. Since $T_{12}$ is a depletion mode device with its gate and source at ground, line $S_2$ will be tied to ground rather than allowed to float. In the alternative case where it is desired to couple line $S_2$ to line $S_3$ while isolating line $S_1$, transistors $T_6$, $T_8$, $T_9$, and $T_{11}$ are preset for operation in the depletion mode, and transistors $T_5$, $T_7$, $T_{10}$ and $T_{12}$ in the enhancement mode. It should be noted that, in either case, transistors $T_5$ and $T_6$ can both be enhancement mode devices; however, this will cause the signal that is coupled onto the output line to be reduced by a threshold voltage. Other applications for the circuit 40 and similar circuits constructed in accordance with these teachings will readily suggest themselves to those skilled in the art.

It will be appreciated that the present invention permits the adaptation of a complex integrated circuit to various different circuit options without changing the basic chip layout. Although these preferred embodiments have been described in detail, it is to be understood that various changes, substitutions and alterations can be made therein without departing from the spirit and scope of the invention as defined in the appended claims.

What is claimed is:

1. A method of making an integrated circuit device having a switch for interconnecting a selected option line to a designated line comprising the steps:
   (a) preparing a semiconductor substrate of a first conductivity type,
   (b) forming a group of transistor sites in a portion of the substrate,
   (c) treating the transistor sites according to a selected option so that at least one of the transistors formed therein will operate in the depletion mode and the transistors formed in the remaining sites in the group will operate in the enhancement mode,
   (d) forming gate electrodes in operative proximity to channel regions in the transistor sites,
   (e) forming first and second regions of a second conductivity type at each transistor site, the regions of the second conductivity type forming sources and drains of the transistors,
   (f) interconnecting each of the first regions to a different option line, and
   (g) interconnecting each of the second regions to the designated line.

2. The method of claim 1 wherein the treating of the transistor sites in step (c) is accomplished by selectively implanting ions of a conductivity-type altering impurity into the channel regions of the sites selected to operate in the depletion mode.

* * * * *